(12) United States Patent
Jung

(10) Patent No.: US 7,521,311 B2
(45) Date of Patent: Apr. 21, 2009

(54) SEMICONDUCTOR DEVICE AND METHOD FOR FABRICATING THE SAME

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 242 days.

(21) Appl. No.: 11/129,002

(22) Filed: May 13, 2005

(65) Prior Publication Data
US 2005/0247984 A1 Nov. 10, 2005

(30) Foreign Application Priority Data
May 10, 2004 (KR) .................. 10-2004-0032729

(51) Int. Cl.
*H01L 21/336* (2006.01)
(52) U.S. Cl. .................. 438/217; 257/E21.625
(58) Field of Classification Search .................. 438/142, 438/197, 216, 217, 218, 289, 174, 194
See application file for complete search history.

(56) References Cited

U.S. PATENT DOCUMENTS

| | | | |
|---|---|---|---|
| 5,063,172 A * | 11/1991 | Manley | 438/265 |
| 6,025,267 A * | 2/2000 | Pey et al. | 438/656 |
| 6,156,593 A * | 12/2000 | Peng et al. | 438/200 |
| 6,348,387 B1 * | 2/2002 | Yu | 438/303 |
| 6,559,016 B2 * | 5/2003 | Tseng et al. | 438/302 |
| 6,630,721 B1 * | 10/2003 | Ligon | 257/413 |
| 6,686,632 B2 * | 2/2004 | Ogura et al. | 257/374 |
| 6,730,554 B1 * | 5/2004 | Baldwin et al. | 438/210 |
| 6,864,143 B1 * | 3/2005 | Shue et al. | 438/299 |
| 7,126,189 B2 * | 10/2006 | Hsieh | 257/336 |

OTHER PUBLICATIONS

Hiromasa Noda, Fumio Murai, and Shin'ichiro Kimura; Threshold Voltage Controlled 0.1-μM. MOSFET Utilizing Inversion Layer as Extreme Shallow Source/Drain; IEDM Tech. Dig. (1993): 93-123; pp. 123 to 126; IEEE 1993.

* cited by examiner

*Primary Examiner*—Alexander G Ghyka
*Assistant Examiner*—Reema Patel
(74) *Attorney, Agent, or Firm*—Andrew D. Fortney

(57) ABSTRACT

A semiconductor device and a method for fabricating the same is disclosed, in which one line is formed from a main gate to a sidewall gate, so that it is possible to scale a transistor below nano degree, and the semiconductor device includes a semiconductor substrate; a device isolation layer for dividing the semiconductor substrate into a field region and an active region; a main gate on a predetermined portion of the active region of the semiconductor substrate; a sidewall gate at both sides of the main gate on the semiconductor substrate; a main gate insulating layer between the main gate and the semiconductor substrate; a sidewall gate insulating layer between the sidewall gate and the semiconductor substrate; an insulating interlayer between the main gate and the sidewall gate; a first silicide layer on the surface of the main gate and the sidewall gate, to electrically connect the main gate with the sidewall gate; and source and drain regions at both sides of the sidewall gate in the active region of the semiconductor substrate.

18 Claims, 7 Drawing Sheets

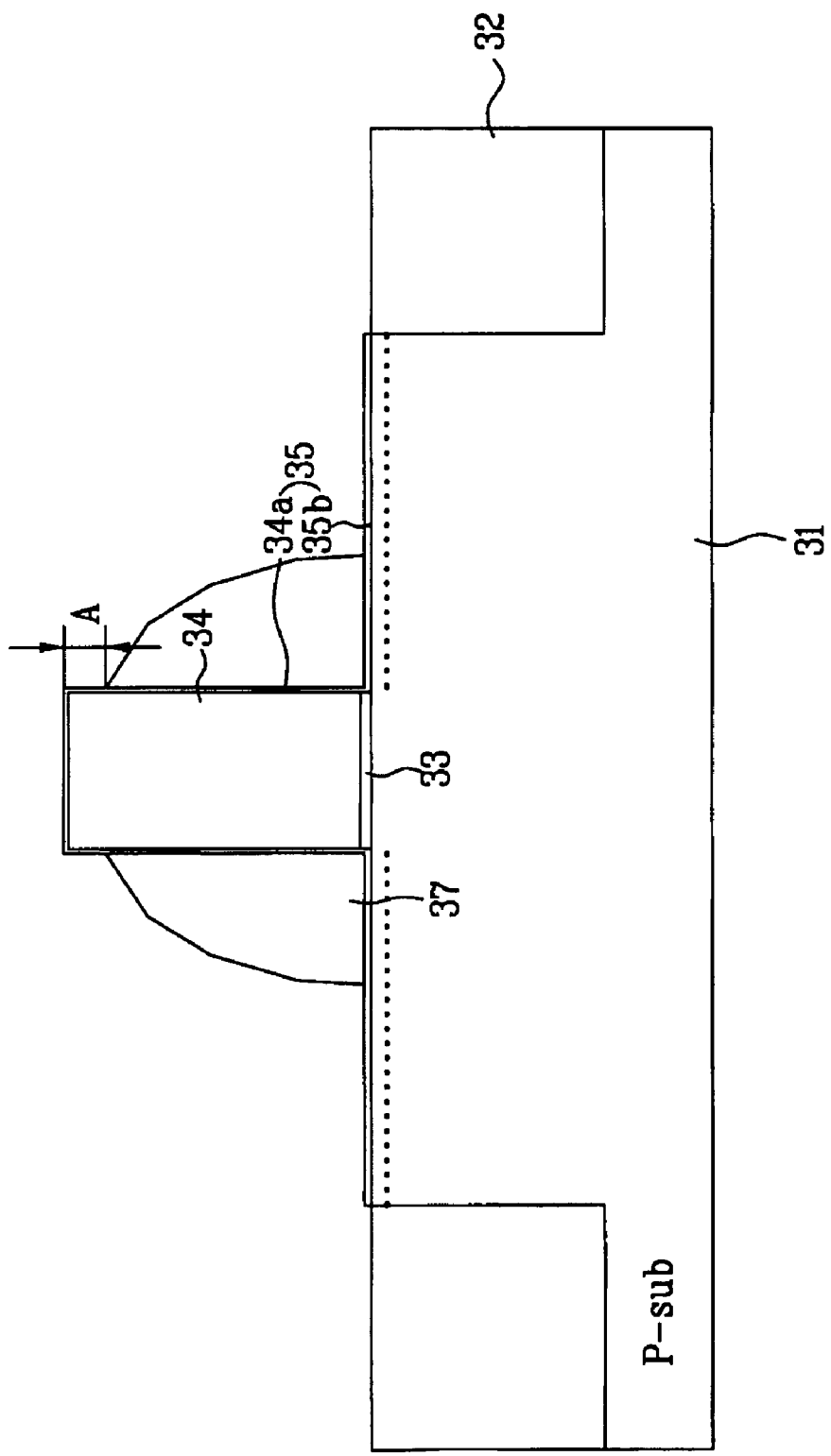

SEMICONDUCTOR DEVICE AND METHOD FOR FABRICATING THE SAME

CROSS-REFERENCE TO RELATED APPLICATIONS

This application claims the benefit of Korean Application No. P2004-32729, filed on May 10, 2004, which is hereby incorporated by reference as if fully set forth herein.

BACKGROUND OF THE INVENTION

1. Field of the Invention

The present invention relates to a semiconductor device, and more particularly, to a semiconductor device and a method for fabricating the same, to obtain high integration in the semiconductor device by scaling a transistor below nano degree.

2. Discussion of the Related Art

In case of a general MOS device, a gate is formed on a semiconductor substrate, and impurity ions are implanted to the semiconductor substrate in state of using the gate as a mask, and then a following thermal process is performed thereto, to diffuse the implanted impurity ions, thereby forming source and drain diffusion regions.

However, if the gate has a length below 0.06 μm, the source diffusion region may be connected with the drain diffusion region since the implanted impurity ions are diffused in the following thermal process. In this reason, it is impossible to fabricate a MOS transistor.

Even in case the gate has a length above 0.06 μm, it is impossible to perform a shallow junction between the source diffusion region and the drain diffusion region, below 10 nm. Accordingly, a drain electric field of the MOS transistor may permeate to a channel region, whereby a threshold voltage is lowered. Also, a short channel effect such as a drain induced barrier lowering DIBL may generate.

The alternative to the source and drain diffusion regions in the transistor of nano degree below 0.1 μm is virtual source and drain diffusion regions of using a sidewall gate. The virtual source and drain diffusion regions have been mentioned in "Threshold Voltage Controlled 0.1 μm MOSFET Utilizing Inversion Layer as Extreme Shallow Source/Drain" (H. Noda, F. Murai and S. Kimura in IEDM Tech. Dig., 1993, pp. 123-126), published in 1993.

FIG. 1 is a cross sectional view of an NMOS device having virtual source and drain regions according to the related art.

As shown in FIG. 1, an STI oxide layer 12 is formed in a field region of a p-type semiconductor substrate 11, whereby the p-type semiconductor substrate 11 is divided into the field region and an active region. Then, a main gate 14, highly doped with n-type impurity ions, is formed on a predetermined portion of the active region of the semiconductor substrate 11. Also, a sidewall gate 15 is formed at both sides of the main gate 14, wherein the sidewall gate 15 is formed of highly doped n-type impurity ions.

Furthermore, a main gate insulating layer 13 is formed between the main gate 14 and the semiconductor substrate 11. Also, another insulating layer 16 is formed between the main gate 14 and the sidewall gate 15. In addition, a sidewall gate insulating layer 17 is formed between the sidewall gate 15 and the semiconductor substrate 11.

Then, source and drain regions 18 and 19 are formed at both sides of the sidewall gate 15 in the active region of the semiconductor substrate 11. Also, a main gate line 20a, a sidewall gate line 20b, and source and drain lines 20c and 20d are respectively connected with the main gate 14, the sidewall gate 15, and the source and drain regions 18 and 19.

In case of a PMOS device, it has the same structure as the NMOS device except that the implanted impurity ions are opposite, whereby the explanation for the structure of the PMOS device will be omitted.

In the NMOS transistor, when a predetermined voltage is applied to the sidewall gate 15, an inversion layer is formed in the semiconductor substrate 11 below the sidewall gate 15. At this time, the inversion layer functions as virtual source and drain regions 18a and 19a, which correspond to the lightly doped source and drain regions of the MOS transistor.

On applying a predetermined voltage to the main gate 14, a channel is formed in the semiconductor substrate 11 below the main gate 14, whereby a current flows between the virtual source region 18a and the virtual drain region 19a.

As shown in the drawings, the related art MOS device requires the sidewall gate line 20b as well as the main gate line 20a, to apply the predetermined voltage to the sidewall gate 15. In this state, according to the increase of integration, it is difficult to form the sidewall gate line 20b.

During a silicide process, the sidewall gate 15 and the main gate 14 may be short. Also, since there is requirement for insulating the main gate line 20a from the sidewall gate line 20b, it is difficult to scale the MOS transistor below nano degree.

SUMMARY OF THE INVENTION

Accordingly, the present invention is directed to a semiconductor device and a method for fabricating the same that substantially obviates one or more problems due to limitations and disadvantages of the related art.

An object of the present invention is to provide a semiconductor device and a method for fabricating the same, in which one line is formed from a main gate to a sidewall gate, so that it is possible to scale a transistor below nano degree.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a semiconductor device includes a semiconductor substrate; a device isolation layer for dividing the semiconductor substrate into a field region and an active region; a main gate on a predetermined portion of the active region of the semiconductor substrate; a sidewall gate at both sides of the main gate on the semiconductor substrate; a main gate insulating layer between the main gate and the semiconductor substrate; a sidewall gate insulating layer between the sidewall gate and the semiconductor substrate; an insulating interlayer between the main gate and the sidewall gate; a first silicide layer on the surface of the main gate and the sidewall gate, to electrically connect the main gate with the sidewall gate; and source and drain regions at both sides of the sidewall gate in the active region of the semiconductor substrate.

In another aspect, a method for fabricating a semiconductor device includes the steps of forming a device isolation layer on a field region of a first conductive type semiconductor substrate; implanting first conductive type impurity ions for controlling a threshold voltage of main gate to an active region of the semiconductor substrate; forming a main gate insulating layer and a main gate on a predetermined portion of the active region of the semiconductor substrate; forming an insulating layer on an entire surface of the semiconductor substrate including the main gate; implanting second type impurity ions for controlling a threshold voltage of sidewall gate to the active region of the semiconductor substrate in state of using the main gate as a mask; forming a sidewall gate at both sides of the main gate; forming source and drain regions at both sides of the sidewall gate in the semiconductor substrate; forming a silicide block layer at both sides of the sidewall gate; and forming a first silicide layer on the main gate and the adjacent portion of the sidewall gate by performing a silicide process in state of using the silicide block layer as a mask.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 3A to FIG. 3E are cross sectional views of the process for fabricating an NMOS device having virtual source and drain regions according to the preferred embodiment of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a method for fabricating the same according to the present invention will be described with reference to the accompanying drawings.

Figure 1:
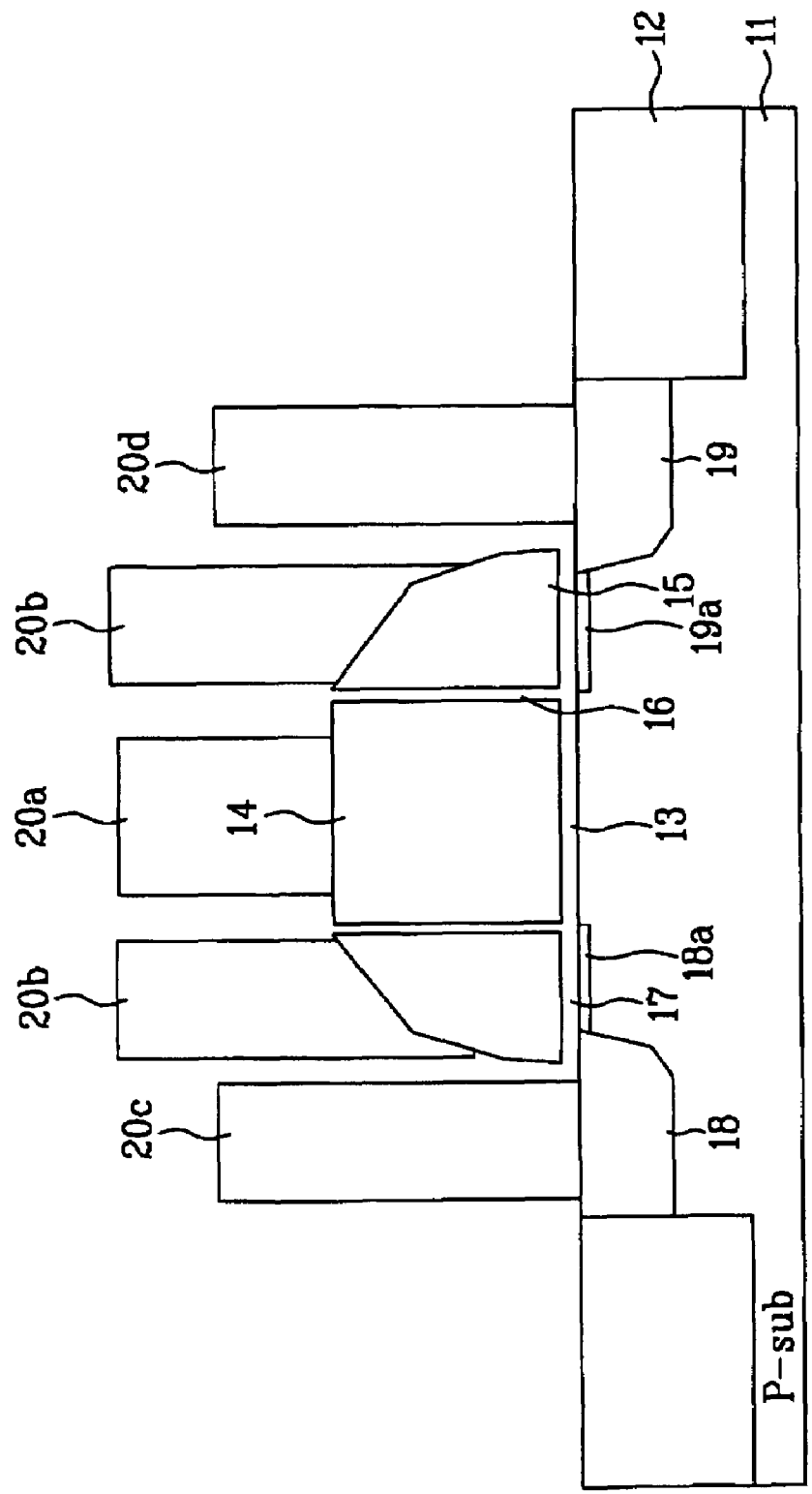
FIG. 1 is a cross sectional view of an NMOS device having virtual source and drain diffusion regions according to the related art.
Figure 2:
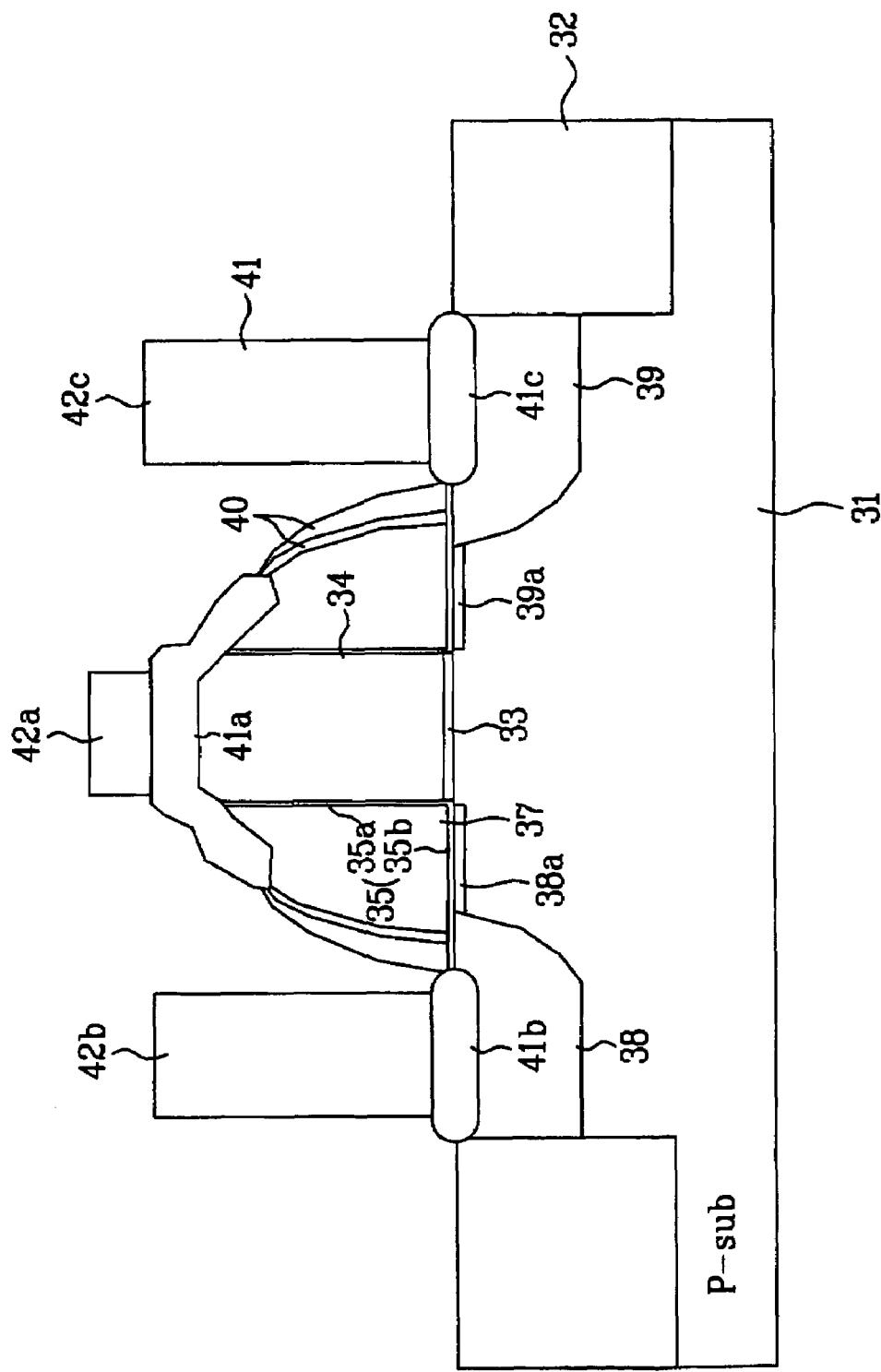
FIG. 2 is a cross sectional view of an NMOS device having virtual source and drain regions according to the preferred embodiment of the present invention.

FIG. 2 is a cross sectional view of an NMOS device having virtual source and drain regions according to the preferred embodiment of the present invention.

In a semiconductor device according to the present invention, as shown in FIG. 2, a p-type semiconductor substrate 31 is defined as an active region and a field region, and a device isolation layer 32 of an STI structure is formed in the field region of the p-type semiconductor substrate 31. Also, a main gate 34 of highly doped n-type impurity ions is formed on a predetermined portion of the active region of the p-type semiconductor substrate 31. In addition, a sidewall gate 37 of highly doped n-type impurity ions is formed at both sides of the main gate 34.

Then, a main gate insulating layer 33 is formed between the main gate 34 and the p-type semiconductor substrate 31. Also, another insulating layer 35a is formed between the main gate 34 and the sidewall gate 37, and a sidewall gate insulating layer 35b is formed between the sidewall gate 37 and the semiconductor substrate 31.

Also, virtual source and drain regions 38a and 39a are formed in the p-type semiconductor substrate 31 below the sidewall gate 37, wherein the virtual source and drain regions 38a and 39a are formed by a shallow junction of about 50 Å. Then, source and drain regions 38 and 39 are formed at both sides of the sidewall gate 37 in the p-type semiconductor substrate 31.

In the meantime, a silicide layer 41a is formed on the main gate 34 and the adjacent portion of the sidewall gate 37. Accordingly, the main gate 34 is electrically connected with the sidewall gate 37 by the silicide layer 41a. Also, a silicide block layer 40 is formed at the side of the sidewall gate 37 having no silicide layer 41a formed thereon. The silicide block layer 40 may be formed of a single insulating layer or a dual insulating layer, for example, in a stack structure of an oxide layer and a nitride layer.

Also, additional silicide layers 41b and 41c are formed on the surface of the source and drain regions 38 and 39. Then, the respective silicide layers 41a, 41b and 41c are connected with a gate line 42a, a source line 42b and drain line 42c.

In the meantime, p-type impurity ions are implanted to the p-type semiconductor substrate 31 below the main gate 34, thereby controlling a threshold voltage of the main gate. Also, n-type impurity ions are implanted to the p-type semiconductor substrate 31 below the sidewall gate 37, thereby controlling a threshold voltage of the sidewall gate. At this time, the impurity ions are implanted at a density of $10^{11} \sim 10^{14}$ ions/$cm^2$, which is at a lower level than a general LDD ion implantation density. At this time, the impurity ions for controlling the threshold voltage of the sidewall gate may not be implanted at need.

In the aforementioned MOS device, when a voltage is applied to the gate line 42a, simultaneously, the voltage is applied to the main gate 34 and the sidewall gate 37 through the silicide layer 41a. In this state, the impurity ions are differently implanted to the p-type semiconductor substrate 31 below the main gate 34 and the sidewall gate 37. Accordingly, a channel layer (not shown) is formed below the main gate 34, and an inversion layer is formed below the sidewall gate 37. The inversion layer serves as the virtual source and drain regions 38a and 39a.

Generally, the threshold voltage in NMOS transistor is expressed as a following equation 1, $$Vt = \phi_{ms} + 2\phi_f - \frac{Q_d}{C_{ox}} + \frac{q(D_p - D_n)}{C_{ox}} \qquad \text{equation 1}$$

wherein, $\phi_{ms}$ is a work function difference [V], $\phi_f$ is a Fermi potential [V], $Q_d$ is a depletion region charge [C/{cm}^{3}], $C_{ox}$ is a gate oxide capacitance, q is an electron's charge [C], $D_p$ is a p-type dopant adjust dose [$cm^{-2}$], and $D_n$ is an n-type dopant adjust dose [$cm^{-2}$].

If the impurity ions for controlling the threshold voltage of the sidewall gate are not implanted to the p-type semiconductor substrate 31, the value of $D_p$ increases due to implantation of the p-type impurity ions for controlling the threshold voltage of the main gate. As a result, the value of $$\frac{q(D_p - D_n)}{C_{ox}}$$

increases, whereby the threshold voltage of the sidewall gate 37 is lower than the threshold voltage of the main gate 34.

Also, if the impurity ions for controlling the threshold voltage of the sidewall gate are implanted to the p-type semiconductor substrate 31, the value of $D_p$ increases due to implantation of the p-type impurity ions for controlling the threshold voltage of the main gate. As a result, the value of $$\frac{q(D_p - D_n)}{C_{ox}}$$

increases, whereby the threshold voltage of the main gate 34 increases. In the meantime, the value of $D_n$ increases due to implantation of the n-type impurity ions for controlling the threshold voltage of the sidewall gate. Accordingly, the value of $$\frac{q(D_p - D_n)}{C_{ox}}$$

decreases, whereby the threshold voltage of the sidewall gate 37 decreases. That is, the threshold voltage of the sidewall gate 37 is lower than the threshold voltage of the main gate 34.

Accordingly, when a predetermined voltage is applied to the gate line 42a, a carrier density in the inversion layer formed below the sidewall gate 37 is greater than a carrier density in the channel layer formed below the main gate 34, whereby it is possible to efficiently form the virtual source and drain regions 38a and 39a.

Also, when the predetermined voltage is not applied to the gate line 42a, that is, in case of a turn-off state, if the threshold voltage of the sidewall gate 37 is above 0, the inversion layer disappears. Also, even if the threshold voltage of the sidewall gate 37 is below 0, the carrier density of the inversion layer becomes lower than that in a turn-on state, thereby preventing the characteristics of punch-through and leakage.

A method for fabricating the NMOS device having the virtual source and drain regions according to the present invention will be described as follows.

FIG. 3A to FIG. 3E are cross sectional views of the process for fabricating the NMOS device having the virtual source and drain regions according to the preferred embodiment of the present invention.

Figure 3A:
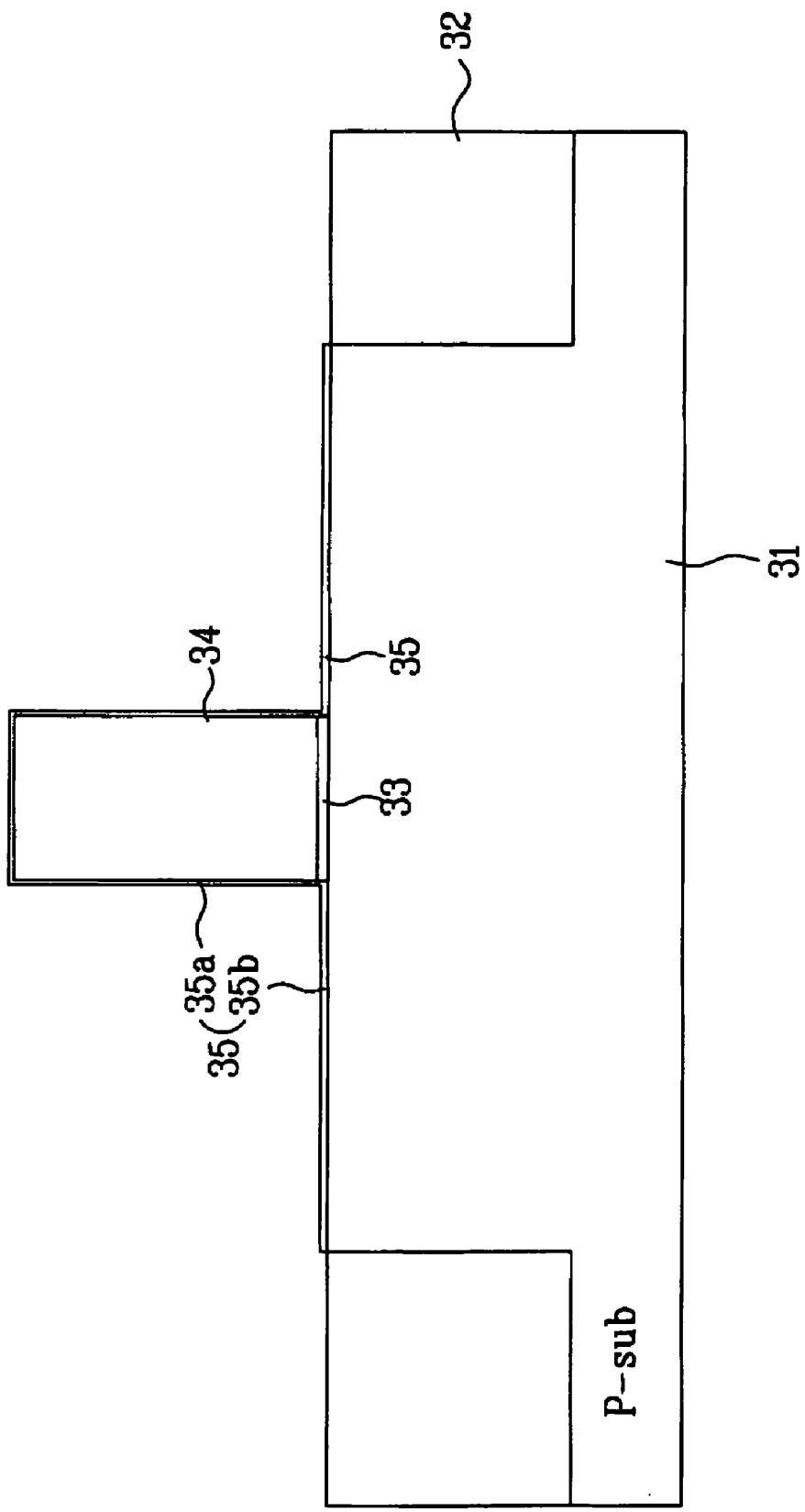

As shown in FIG. 3A, the field region of the p-type semiconductor substrate 31 is etched at a predetermined depth, thereby forming a trench. Then, an insulating layer is formed in the trench, whereby the device isolation layer 32 of the STI structure is formed in the field region of the p-type semiconductor substrate 31. At this time, the portion of the p-type semiconductor substrate 31 having no device isolation layer 32 serves as the active region.

Although not shown, impurity ions are implanted to the active region of the p-type semiconductor substrate 31, thereby forming a well region. Then, the impurity ions for controlling the threshold voltage of the main gate are implanted to the active region of the p-type semiconductor substrate 31 in correspondence with the portion below the sidewall gate as well as the portion below the main gate. That is, the p-type impurity ions (B, In, etc.) are implanted at a density of $10^{12}$ to $10^{13}$ atoms/cm$^2$. In case of a PMOS device, n-type impurity ions (P, As, Sb, etc.) are implanted.

Subsequently, a first oxide layer and a first polysilicon layer are sequentially formed on the semiconductor substrate 31, and then are selectively removed to remain on the predetermined portion of the active region of the semiconductor substrate 31, thereby forming the main gate 34 and the main gate insulating layer 33.

Next, a second oxide layer 35 is formed on an entire surface of the semiconductor substrate 31 including the main gate 34. The second oxide layer 35 is formed at both sides of the main gate 34, wherein the second oxide layer 35 functions as the sidewall gate insulating layer ('35b' of FIG. 2), to insulating the sidewall gate from the semiconductor substrate 31.

Figure 3B:
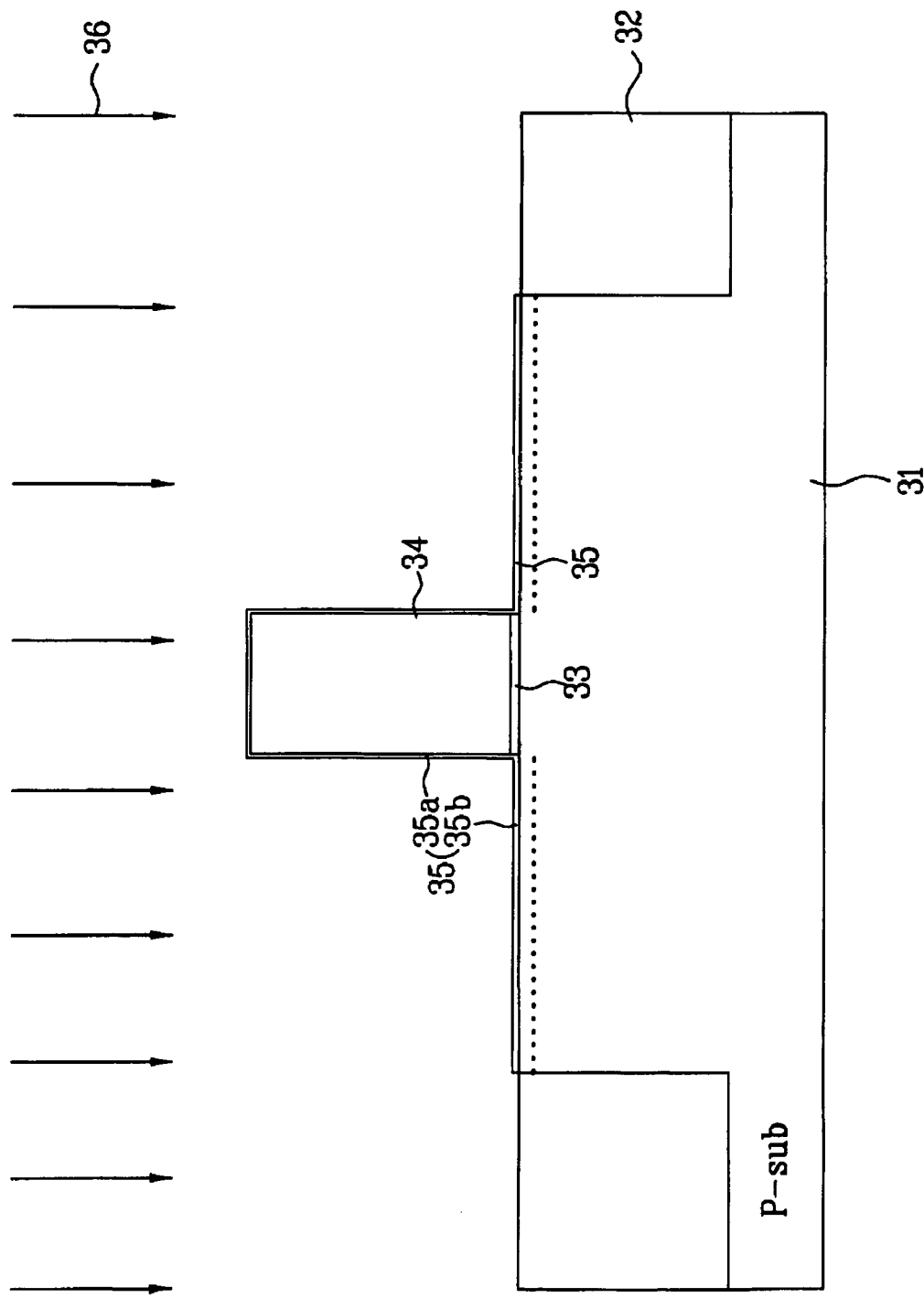

Referring to FIG. 3B, the impurity ions 36 for controlling the threshold voltage of the sidewall gate are implanted to the semiconductor substrate 31 in state of using the main gate 34 as a mask, and then a rapid thermal annealing RTA process or a spike annealing process is performed thereto, thereby diffusing the implanted impurity ions.

The impurity ions 36 for controlling the threshold voltage of the sidewall gate are formed of n-type impurity ions such as phosphorous P, arsenic As or antimony Sb, wherein the n-type impurity ions are implanted at an energy between 1 KeV and 100 KeV. At this time, the n-type impurity ions may be implanted at a density of $10^{11} \sim 10^{14}$ [ions/cm$^2$], for a shallow junction.

In case of the NMOS device, the impurity ions for controlling the threshold voltage of the sidewall gate may be used of phosphorous P, arsenic As or antimony Sb. Meanwhile, in case of a PMOS device, the impurity ions for controlling the threshold voltage of the sidewall gate may be used of boron B or indium In.

The process of implanting the impurity ions 36 for controlling the threshold voltage of the sidewall gate is performed in a count-doping method, to lower the threshold voltage of the sidewall gate. In this case, if the same voltage is applied to the main gate 34 and the sidewall gate, the carrier density in the inversion layer formed below the sidewall gate is greater than the carrier density in the channel layer formed below the main gate 34. Accordingly, it is possible to efficiently form the virtual source and drain regions.

In the meantime, the impurity ions for controlling the threshold voltage of the main gate are implanted to the semiconductor substrate 31 below the main gate 34. Accordingly, even though the process of implanting the impurity ions 36 for controlling the threshold voltage of the sidewall gate is not performed, it is possible to maintain the threshold voltage of the sidewall gate at a lower level than the threshold voltage of the main gate 34. That is, the process of implanting the impurity ions 36 for controlling the threshold voltage of the sidewall gate, shown in FIG. 3B, may be omitted. In this case, it may generate the decrease in efficiency of forming the virtual source and drain regions, as compared with the case of performing the impurity ion implantation process for controlling the threshold voltage of the sidewall gate.

In the aforementioned method, the process of implanting the impurity ions 36 for controlling the threshold voltage of the sidewall gate is performed after forming the second oxide layer 35. However, the second oxide layer 35 may be formed after performing the process of implanting the impurity ions 36 for controlling the threshold voltage of the sidewall gate.

As shown in FIG. 3C, a second polysilicon layer is formed on the entire surface of the semiconductor substrate 31 including the main gate 34, wherein the second polysilicon layer is formed of highly doped n-type impurity ions. Then, the second polysilicon layer is anisontropically etched-back, whereby the sidewall gate 37 is formed at both sides of the main gate 34. The sidewall gate 37 is insulated from the main gate 34 by the insulating layer 35a, and the sidewall gate 37 is also insulated from the semiconductor substrate 31 by the sidewall gate insulating layer 35b.

To obtain easiness in the following silicide process and to lower the resistance in gate line, the etching process is controlled such that the top of the sidewall gate 37 is lower at a predetermined degree A than the top of the main gate 34.

Figure 3D:
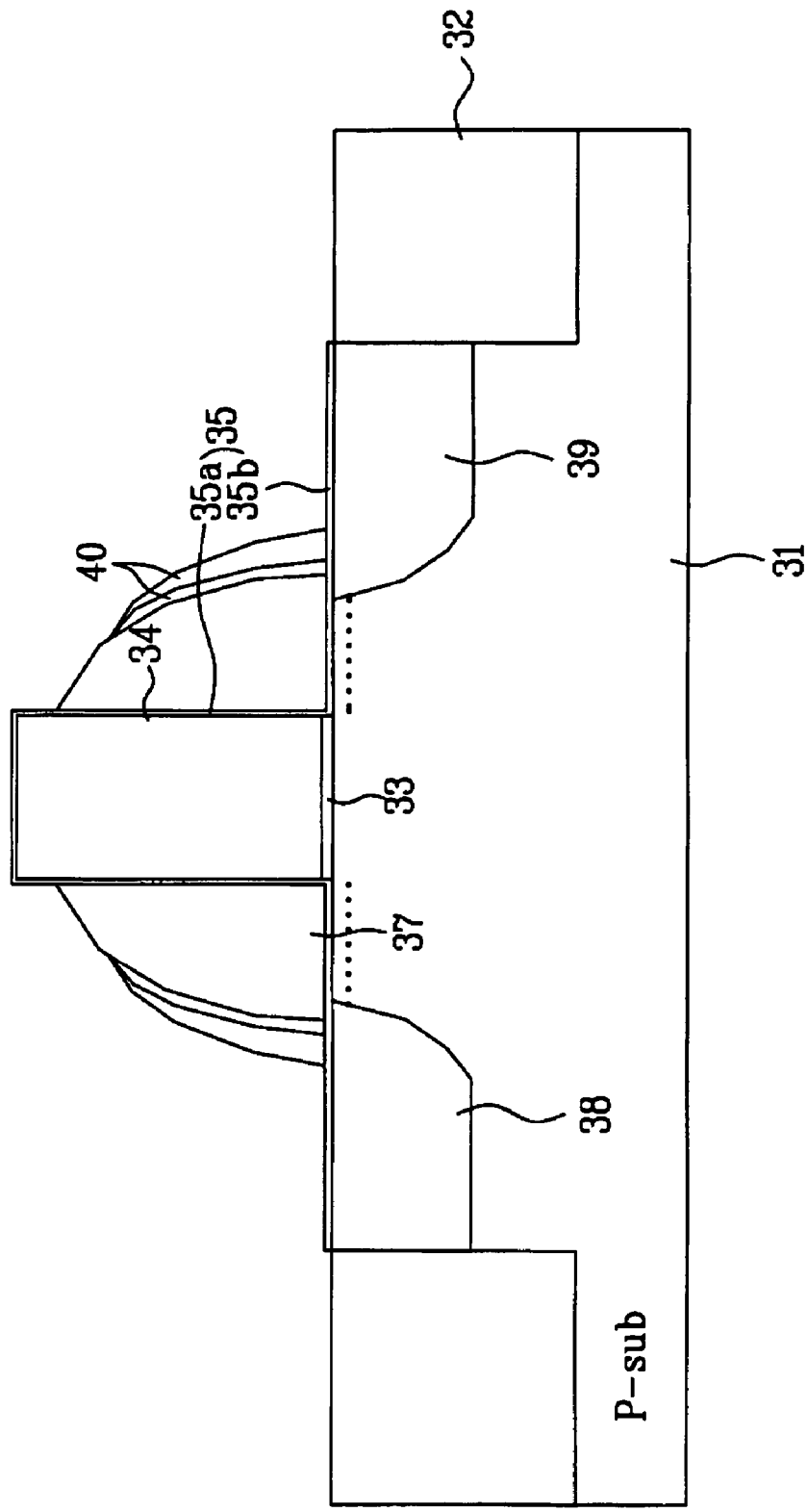

As shown in FIG. 3D, impurity ions are implanted to the active region of the semiconductor substrate 31 in state of using the main gate 34 and the sidewall gate 37 as a mask. Then, a rapid thermal annealing RTA process or a spike annealing process may be performed thereto, whereby the source and drain regions 38 and 39 are formed by the diffusion of implanted impurity ions.

Then, an oxide layer and a nitride layer are sequentially formed on the entire surface of the semiconductor substrate 31, and then are etched anisotropically, whereby the silicide block layer 40 is formed at the side of the sidewall gate 37.

As mentioned above, the silicide block layer 40 may be formed as the dual insulating layer including the oxide layer and the nitride layer. Although not shown, the silicide block layer 40 may be formed as the single insulating layer.

Figure 3E:
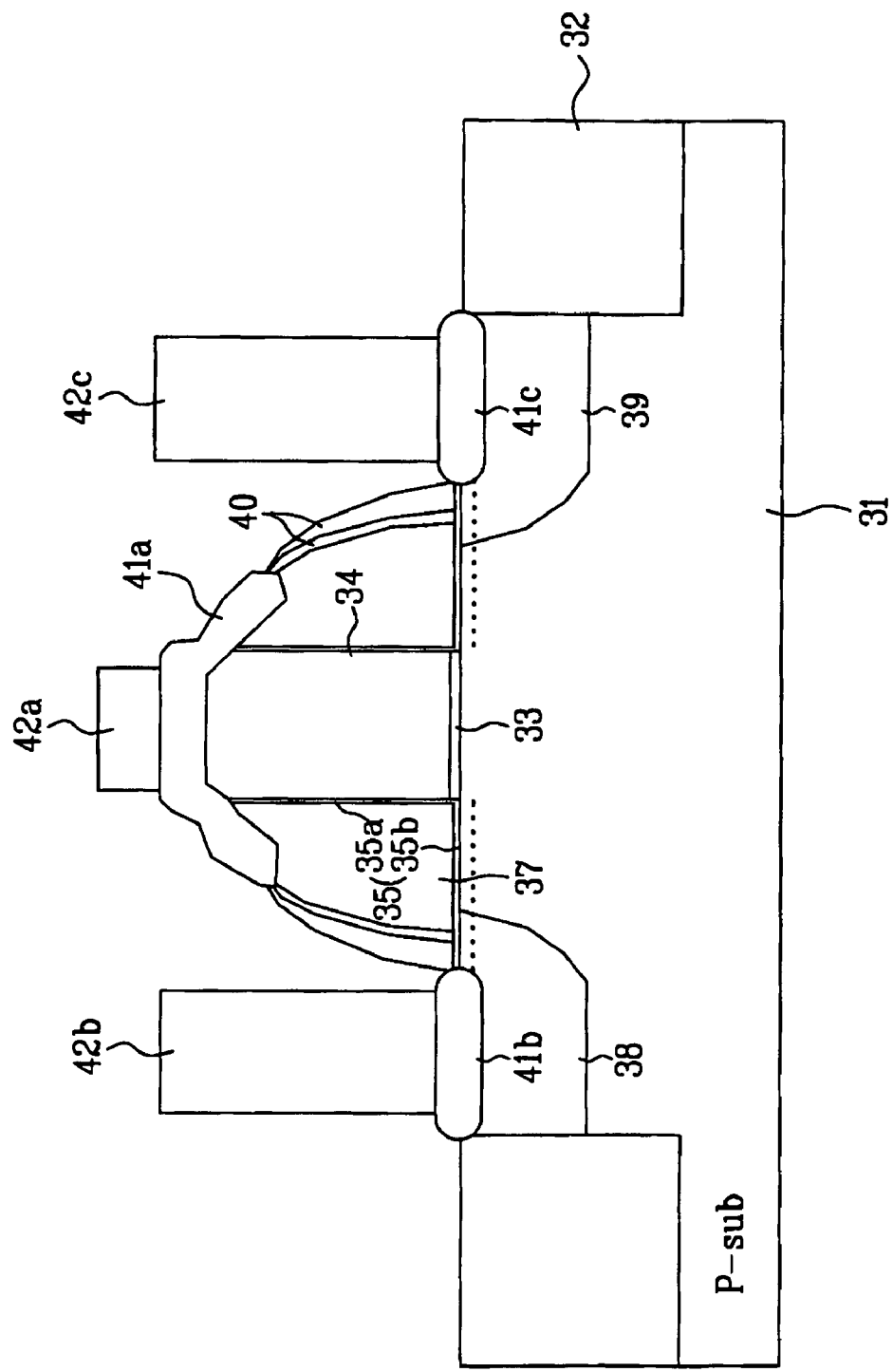

As shown in FIG. 3E, the main gate 34 and the source and drain regions 38 and 39 are exposed by removing the second oxide layer 35 on the exposed surface in correspondence with the main gate 34 and the source and drain regions 38 and 39.

Next, a refractory metal layer is formed on the entire surface of the semiconductor substrate, and then a thermal process is performed thereto. Then, the silicide process is performed onto the interface (main gate 34, sidewall gate 37, and source and drain regions 38 and 39) between the refractory metal layer and the polysilicon layer, thereby forming the respective silicide layers 41a, 41b and 41c. At this time, the silicide layer 41a is formed on the main gate 34 and the exposed surface of the sidewall gate positioned at both sides of the main gate 34. Also, the silicide layers 41b and 41c are respectively formed on the source and drain regions 38 and 39.

Then, an insulating interlayer (not shown) is formed on the entire surface of the semiconductor substrate, and contact holes are formed in the insulating interlayer, to expose the predetermined portions of the respective silicide layers 41a, 41b and 41c. After that, a conductive layer is formed in the contact holes, whereby the gate line 42a, the source line 42b and the drain line 42c are respectively connected with the silicide layers 41a, 41b and 41c. Accordingly, it is possible to complete the MOS device having the virtual source and drain regions according to the present invention.

The process of fabricating the PMOS device is same as the process of fabricating the MOS device except that the implanted impurity ions are opposite, whereby the explanation for the process of fabricating the PMOS device will be omitted.

As mentioned above, the semiconductor device and the method for fabricating the same according to the present invention has the following advantages.

First, there is no requirement for forming the line in the sidewall gate, thereby simplifying the fabrication process. Also, since there is no requirement for forming the line in the sidewall gate, the transistor may be easily scaled below nano degree.

According to the gate voltage applied to turn on and off the main gate, the density of the inversion layer for forming the virtual source and drain regions is changed, so that it is possible to prevent the characteristics of punch-through and leakage in the turn-off state.

In addition, the respective source and drain regions are thinly formed at about 50 Å by the shallow junction, thereby preventing the short channel effect of the MOS transistor. Accordingly, even though the channel length of the MOS transistor is scaled below 50 nm, it is possible to prevent the short channel effect, thereby improving the reliability.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a semiconductor device comprising:

forming a device isolation layer on a field region of a first conductive type semiconductor substrate;

implanting first conductive type impurity ions for controlling a threshold voltage of a subsequently formed main gate in an active region of the semiconductor substrate;

forming a main gate insulating layer and the main gate on a predetermined portion of the active region of the semiconductor substrate;

forming a first insulating layer on an entire surface of the semiconductor substrate including the main gate;

implanting second conductive type impurity ions for controlling a threshold voltage of a subsequently formed sidewall gate in the active region of the semiconductor substrate using the main gate as a mask;

forming the sidewall gate at opposite sides of the main gate;

forming source and drain regions at opposite sides of the sidewall gate in the semiconductor substrate;

forming a suicide block layer on opposite sides of the sidewall gate that leaves a portion of the sidewall gate exposed; and forming a silicide layer on the main gate and the exposed portion of the sidewall gate by performing a silicide process using the silicide block layer as a mask, wherein the silicide layer electrically connects main gate and sidewall gate.

2. The method of claim 1, further comprising, forming the silicide layer on a surface of the source and drain regions.

3. The method of claim 2, further comprising, forming a gate line, a source line and a drain line connected with the silicide layer.

4. The method of claim 1, wherein implanting the second conductive type impurity ions comprises count-doping the first conductive type impurity ions.

5. The method of claim 1, wherein the device is an NMOS device, the first conductive type impurity ions are p-type impurity ions, and the second conductive type impurity ions are n-type impurity ions.

6. The method of claim 1, wherein the second conductive type impurity ions are implanted into the semiconductor substrate before forming the insulating layer.

7. The method of claim 1, wherein the impurity ions for controlling the threshold voltage of the sidewall gate are implanted at a density of $10^{11}$~$10^{14}$ ions/cm$^2$.

8. The method of claim 7, wherein the impurity ions for controlling the threshold voltage of the sidewall gate are implanted at an energy of 1 KeV~100 KeV.

9. The method of claim 1, wherein the step of forming the sidewall gate includes:

forming a polysilicon layer highly doped with the first conductive type impurity ions on the entire surface of the semiconductor substrate; and anisotropically etching the polysilicon layer to remain at the opposite sides of the main gate.

10. The method of claim 9, wherein the process of anisotropically etching the polysilicon layer is performed until the top of the sidewall gate is lower than the top of the main gate.

11. The method of claim 1, wherein the step of forming the silicide block layer includes:
   forming a second insulating layer having a single or dual stack structure; and
   blanket-etching the second insulating layer to remain at opposite sides of the sidewall gate.

12. The method of claim 1, wherein the step of forming the silicide layer includes:
   removing an exposed surface of the first insulating layer from the main gate;
   forming a refractory metal layer on the entire surface of the semiconductor substrate;
   forming a silicide layer on the main gate and the exposed sidewall gate by reacting part of the refractory metal layer with exposed silicon; and
   removing the remaining refractory metal layer.

13. The method of claim 1, wherein the silicide block layer exposes portions of the sidewall gate.

14. The method of claim 1, wherein forming the device isolation layer comprises etching the field region of the semiconductor substrate to a predetermined depth to form a trench, then forming an insulating layer in the trench to form the device isolation layer in the field region.

15. The method of claim 1, wherein the first conductive type impurity ions for controlling the threshold voltage of the main gate are implanted at a density of $10^{12}$ to $10^{13}$ atoms/cm$^2$.

16. The method of claim 1, wherein the first insulating layer comprises an oxide layer.

17. The method of claim 1, further comprising diffusing the implanted second conductive type impurity ions by a rapid thermal annealing (RTA) process or a spike annealing process.

18. The method of claim 1, wherein forming the source and drain regions comprises implanting impurity ions into the active region of the semiconductor substrate using the main gate and the sidewall gate as a mask, then performing a rapid thermal annealing (RTA) process or a spike annealing process to diffuse the implanted impurity ions.

* * * * *